United States Patent [19]
Wolk et al.

[11] Patent Number: 5,412,310
[45] Date of Patent: May 2, 1995

[54] SWITCHABLE INDUCTOR FOR STRONG CURRENTS

[75] Inventors: Ivan Wolk, Arnouville les Gonesse; Guy Boulzaguet, Nanterre, both of France

[73] Assignee: Thomson-CSF, Puteaux, France

[21] Appl. No.: 57,829

[22] Filed: May 7, 1993

[30] Foreign Application Priority Data

May 12, 1992 [FR] France .................. 92 05722

[51] Int. Cl.⁶ .................. H01F 21/00; H03J 5/00
[52] U.S. Cl. .................. 323/355; 333/174; 334/56; 334/59; 343/861
[58] Field of Search .......... 330/120, 121; 323/355, 323/359, 363, 205, 206, 208, 209, 210; 333/118, 177, 174; 334/41, 47, 56, 59, 60, 71; 343/861

[56] References Cited

U.S. PATENT DOCUMENTS

| | | | |
|---|---|---|---|
| 3,601,717 | 8/1971 | Kuecken | 343/861 |
| 3,602,788 | 8/1971 | Kawabe et al. | |
| 3,786,338 | 1/1974 | Gilbert | 323/359 |
| 4,131,839 | 12/1978 | Springer | 318/675 |
| 4,439,742 | 3/1984 | Sondermeyer | 330/262 |
| 4,585,974 | 4/1986 | Stupp et al. | 315/307 |
| 4,628,284 | 12/1986 | Bruning et al. | 331/86 |
| 4,654,776 | 3/1987 | Basire | 363/127 |
| 4,670,692 | 6/1987 | Meigs | 315/408 |
| 4,701,732 | 10/1987 | Nestlerode | 334/56 |
| 4,881,129 | 11/1989 | Mitsuhashi | 358/434 |
| 5,003,260 | 3/1991 | Auchterlonie | 324/207.16 |
| 5,047,911 | 9/1991 | Sperzel et al. | 363/56 |
| 5,218,317 | 6/1993 | Boulzaguet et al. | 330/124 R |

FOREIGN PATENT DOCUMENTS

| | | |
|---|---|---|
| 459440 | 12/1991 | European Pat. Off. |
| 2050994 | 4/1972 | Germany |
| 0131216 | 6/1978 | Germany ............... 343/861 |

Primary Examiner—Thomas M. Dougherty
Assistant Examiner—Adolf Berhane
Attorney, Agent, or Firm—Oblon, Spivak, McClelland, Maier, & Neustadt

[57] ABSTRACT

Switchable inductors for strong currents are used especially in antenna tuning circuits. The value of the inductance between the terminals of the primary winding of an air-core static transformer is different depending on whether the secondary winding of the transformer is placed in an open circuit or in a short circuit by switching means formed by power semiconductor elements. Application in particular to antenna coupling circuits for VLF stations working by frequency hop transmission with highly selective antennas.

18 Claims, 1 Drawing Sheet

SWITCHABLE INDUCTOR FOR STRONG CURRENTS

BACKGROUND OF THE INVENTION

The present invention relates to switchable inductors for strong currents, namely for currents of several tens or even several hundreds of amperes. The invention has been developed in the context of antenna tuning circuits.

When an antenna is used for a transmission during which frequency hops are made, it is tempting to use a selective antenna and to modify its tuning at each frequency hop so that the transmission is always done under optimum conditions. This is the case, for example, in transmission with multiple-shift keying (MSK), i.e. transmission using modulation with hops from a frequency Of−dF to a frequency Of−dF and vice versa. Furthermore, the invention has been originally designed for transmission in MSK mode, at frequencies of the order of 15 kHz and with transmitter power values of the order of several hundreds of kilowatts.

Under such conditions of operation, attempts have been made to carry out the tuning with the primary winding of a tranformer with a saturable inductor, the value of the inductance of this transformer being adjusted by means of a direct current source connected to the terminals of the secondary winding and controlled at the pace of the MSK modulation. Unfortunately, this type of device generates high level harmonics owing to the fact that the switchable inductor thus obtained works at points where its value does not vary linearly as a function of the radiofrequency current. Now these harmonics are very difficult to filter.

SUMMARY OF THE INVENTION

The present invention is aimed at preventing or, at least, at reducing the effects of this drawback.

This is obtained by the use of an air-core static transformer, i.e. one with coils but without a core, the secondary winding of which is placed alternately in an open circuit and in a short circuit at the rate of the frequency hops.

According to the present invention, there is provided a switchable inductor for strong currents, comprising an air-core static transformer having a primary winding that constitutes a variable inductor and a secondary winding with a first terminal and a second terminal and switching means connected between the first terminal and the second terminal and a point at fixed potential, these means comprising a first switch and a second switch, of the semiconductor-based open/shut control electrode type, said switches being connected identically between the point at fixed potential and, respectively, the first and second terminals, and two diodes connected identically between the point at fixed potential and, respectively, the first and second terminals, the direction of conduction of the switches being the same when seen from the point at fixed potential, the direction of conduction of the diodes being the same when seen from the point at fixed potential, but the direction for the diodes being the reverse of the direction for the switches.

BRIEF DESCRIPTION OF THE DRAWING

The present invention will be understood more clearly, and other features will appear from the following figures and from the figures pertaining thereto. Of these figures.

In the different figures, the corresponding elements are designated by the same references.

MORE DETAILED DESCRIPTION

Figure 1:
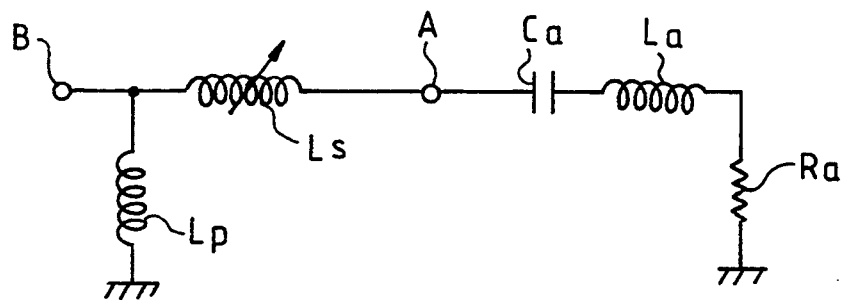
FIG. 1 shows an antenna and an antenna matching circuit relating to the prior art as well as to the invention.

FIG. 1 shows an equivalent electrical diagram of an antenna and, connected to a terminal A providing access to the antenna, a matching circuit for the antenna. The equivalent electrical diagram of the antenna comprises a capacitor Ca, an inductor La and a resistor Ra in series between the terminal A and the ground.

The antenna matching circuit of FIG. 1 comprises two inductors: a first inductor Ls connected between the terminal A and an access terminal B, and a second inductor Lp connected between the terminal B and the ground; the terminal B is designed to be connected to the output of a transmitter. This antenna matching circuit is well known. It is designed to present a purely ohmic impedance to a transmitter connected to the terminal B. If this circuit is tuned to a frequency Of, the circuit + antenna assembly becomes inductive at the frequency Of+dF, with dF positive, and becomes capacitive at the frequency Of−dF. Under these conditions, in MSK modulation, the antenna is never tuned since the transmission frequencies are Of+dF and Of−dF. A known way of obtaining the tuning to the frequencies Of+dF and Of−dF is to carry out a dynamic control of the inductor Ls at the rate of the frequency hops, in such a way that the tuning is always achieved. As indicated further above, dynamically controlled inductors have been designed by means of saturable inductor transformers but have not been satisfactory because of the high rate of harmonics that they produce.

Figure 2:
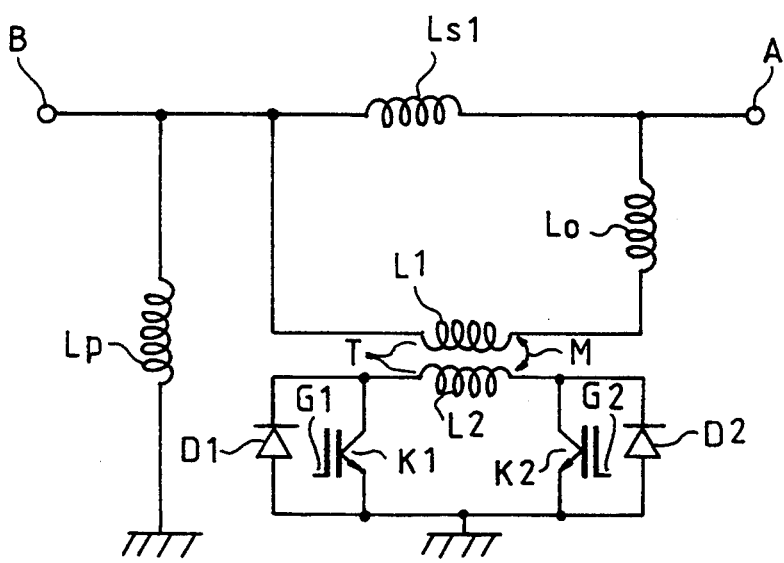
FIG. 2 shows an antenna matching circuit according to the invention.

FIG. 2 is the electrical diagram of an antenna tuning circuit with, as in the case of FIG. 1, the terminals A and B, an inductor Lp mounted between the terminal B and the ground and an inductor mounted between the terminals A and B. This inductor corresponds to the inductor Ls of FIG. 1. It may take two distinct values and comprises: a first inductor Ls1 connected between the terminals A and B, a second inductor Lo, a first end of which is connected to the terminal A, an air-core static transformer T, the primary winding of which constitutes an inductor n1 which has a first terminal connected directly to the terminal B and a second terminal connected to the terminal A through the inductor no and switching means connected between the first terminal and the second terminal of the secondary winding of the transformer T and the ground. Said switching means comprise a first switch K1 and a second switch K2 of the semiconductor-based open/shut control electrode type and a first diode D1 and second diode D2. In the example described, the switches are elements known as IGBTs or Insulated Gate Bipolar Transistors. These IGBTs can be used to cut off very high currents with a very low control voltage. The IGBTs K1 and K2 have their collectors respectively connected to the first end and the second end of the secondary winding of the transformer T and their emitters connected to the ground. Similarly, the diodes D1 and D2 have their cathodes respectively connected to the first end and the second end of the secondary winding of the transformer T and their anodes connected to the ground. According to the way in which the switching means are mounted, if the IGBTs K1, K2 are turned off by an external command applied to their gates G1, G2, the secondary winding of the transformer T is open for the reverse-biased diodes D1, D2 are off. On the contrary, when the IGBTs K1, K2 are turned on by the external command, the secondary winding of the transformer T is short-circuited. Indeed, the current flows from K1 to K2 during one alternation and from K1 to D1 during the other alternation.

Thus, to work at the frequency Of−dF, the secondary winding of the transformer T is open, and the inductor Ls between the points A and B is then constituted by the parallel connection of the inductor Ls1 and of the series-connected inductors Lo and L1. And, to work at the frequency Of−dF, the secondary winding of the transformer T is short-circuited. The inductor Ls between the terminals A and B is then constituted by the parallel connection of inductor Ls1 and of the two series-connected inductors, namely the inductor Lo and the inductor having the value $(1-k^2)L1$, where k is the coefficient of coupling between the primary and secondary windings of the transformer T and where $k^2$ is equal to $M^2/L1.L2$, M designating the mutual inductance between the two windings, and L1 and L2 the respective values of inductance of the two windings.

It must be noted that the primary winding of the transformer T could be positioned directly between the terminals A and B but that, in the example described, in order to reduce the current in the switching means, a current divider has been made by means of the inductors Ls1, L1 and Lo, the values of which are adjusted as a function of the currents that must not be exceeded in the IGBTs and in the diodes, and as a function of the two inductance values to be obtained between the terminals A and B.

The circuit according to FIG. 2 can therefore be used as an antenna tuning circuit in a transmission station working by frequency hops. For this purpose, it suffices to control the opening and closing of the IGBTs at the rate of the frequency hops. And it must be noted that, for a transmission that has to be made on more than two distinct frequencies, it is enough to set up a series connection of several switchable inductors to constitute the antenna tuning circuit and to control the different switchable means as a function of the transmission frequencies, at the rate of the frequency hops.

Among the advantages of the switching means according to FIG. 2, the following must be noted in particular: the linearity of the operation, the absence of parasitic signals due to the switching over and the transmission of the spectrum without distortion.

Figure 3:
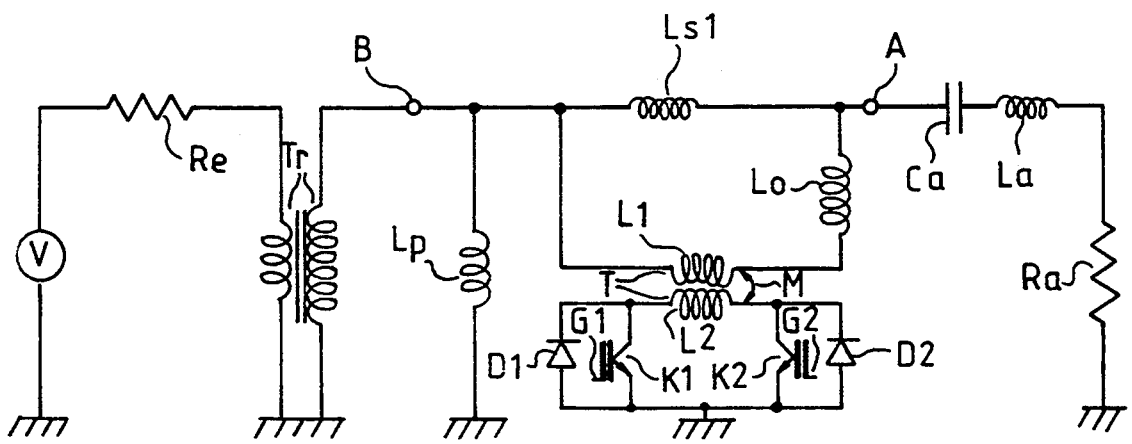
FIG. 3 shows a transmission station with a transmitter, an antenna matching circuit according to FIG. 2 and an antenna.

FIG. 3 shows the circuit according to FIG. 2 used in an antenna matching circuit between a transmitter connected to its terminal B and an antenna represented, as in FIG. 1, by its electrical diagram Ca, La, Ra. The transmitter, which can be likened to a voltage source V and has an internal resistance Re, has, in the example described, one output per transformer, Tr, with a ratio of 2.

The embodiment according to FIG. 3 has been designed for operation in MSK4 mode with:
Of=15.1 kHz and dF=50 Hz, and with V=23.255 volts (peak)
Re=40 ohms
Lp=154.92 µH
Ls1=645.80 µH
L1=L2 =397.06 µH
M=397.06 µH
LO=2.825 mH
Ca=130 nF
La=168.36 nH
Ra=0.216 ohms and the currents observed under nominal operating conditions are:

62 and 31 A (peak) respectively in the primary and secondary windings of the transformer Tr, 3200 A (peak) in the inductor Lp, 3050 A (peak) in the antenna 400 A (peak) in the IGBTs K1 and K2.

What is claimed is:

1. A switchable inductor for strong currents, comprising an air-core static transformer having a primary winding and at least one inductor coupled to the primary winding, and a secondary winding with a first terminal and a second terminal, and switching means connected between the first terminal and the second terminal and a point at a fixed potential, said switching means comprising a first switch and a second switch which are both semiconductor-based open/shut control electrode switches, said switches being connected symmetrically between the point at the fixed potential and, respectively, the first and second terminals, and two diodes connected symmetrically between the point at the fixed potential and, respectively, the first and second terminals, the direction of conduction of the switches being the same when seen from the point at the fixed potential, the direction of conduction of the diodes being the same when seen from the point at the fixed potential, but the direction for the diodes being the reverse of the direction for the switches, the first and second switches varying an inductance across the first and second terminals.

2. A switchable inductor according to claim 1, comprising an inductor with a given value and two access terminals connected by two paths, one of which comprises the primary winding of the transformer while the other comprises the inductor of a given value.

3. A switchable inductor according to claim 1 or claim 2, wherein the switches are IGBTs.

4. A switchable inductor, comprising:
first and second terminals;
a transformer having a primary winding with two terminals and a secondary winding having two terminals, the primary winding being coupled to at least one inductor, the primary winding having the two terminals thereof respectively connected to said first terminal and said second terminal, and the two terminals of the secondary winding being respectively connected to third and fourth terminals;
a switching means, connected to the third and fourth terminals for short circuiting and open circuiting the third and fourth terminals to vary an inductance across the first and second terminals.

5. A switchable inductor according to claim 4, wherein said switching means comprises:
a first switch connected between said third terminal and a point at a fixed potential; and
a second switch connected between said fourth terminal and said point at the fixed potential;

wherein said switching means switches the inductance across the first and second terminals by opening and closing said first and second switches.

6. A switchable inductor according to claim 5, further comprising:
   a first diode connected between said point at the fixed potential and the third terminal; and
   a second diode connected between said point at the fixed potential and the fourth terminal.

7. A switchable inductor according to claim 6, wherein both said first diode and said second diode are connected to allow current to flow in a same direction relative to said fixed point.

8. A switchable inductor according to claim 7, wherein both said first diode and said second diode are connected to allow current to flow away from said fixed point to said third and fourth points respectively.

9. A switchable inductor according to claim 4, wherein said transformer is an air-core transformer.

10. A switchable inductor according to claim 5, wherein both said first switch and said second switch are semiconductor based open/shut control electrode switches.

11. A switchable inductor according to claim 10, wherein both said first switch and said second switch are insulated gate bipolar transistors.

12. A switchable inductor according to claim 4, further comprising: an inductor connected between the second terminal and one of the terminals of the primary winding; and an inductor connected between the first and second terminals in parallel to the connection of said transformer and said inductor which is connected between the second terminal and said one of the terminals of the primary winding.

13. A switchable inductor according to claim 12, further comprising: an inductor connected between ground and said first terminal.

14. A switchable inductor according to claim 5, wherein said point at the fixed potential connected to said first and second switches is ground.

15. A switchable inductor according to claim 5, further comprising: an inductor connected between the second terminal and one of the terminals of the primary winding; and an inductor connected between the first and second terminals in parallel to the connection of said transformer and said inductor which is connected between the second terminal and said one of the terminals of the primary winding.

16. A switchable inductor according to claim 15, further comprising:
   an inductor connected between ground and said first terminal.

17. A switchable inductor, comprising:
   first and second terminals;
   a transformer having a primary winding with two terminals and a secondary winding having two terminals, the primary winding being coupled to at least one inductor, the primary winding having the two terminals thereof respectively connected to said first terminal and said second terminal, and the two terminals of the secondary winding being respectively connected to third and fourth terminals;
   a switching device, connected to the third and fourth terminals, which opens and closes a direct connection between the third and fourth terminals to vary an inductance across the first and second terminals.

18. A switchable inductor according to claim 17, further comprising:
   a first diode connected between a point at the fixed potential and the third terminal; and
   a second diode connected between said point at the fixed potential and the fourth terminal;
   wherein both said first diode and said second diode are connected to allow current to flow in a same direction relative to said fixed point.

* * * * *